United States Patent
Zhong et al.

(10) Patent No.: US 9,190,557 B2
(45) Date of Patent: Nov. 17, 2015

(54) ULTRAVIOLET SEMICONDUCTOR LIGHT-EMITTING DEVICE AND FABRICATION METHOD

(71) Applicant: XIAMEN SANAN OPTOELECTRONICS TECHNOLOGY CO., LTD., Xiamen (CN)

(72) Inventors: Zhibai Zhong, Xiamen (CN); Jianjian Yang, Xiamen (CN); Wenxin Chen, Xiamen (CN); Zhaoxuan Liang, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 14/612,156

(22) Filed: Feb. 2, 2015

(65) Prior Publication Data

US 2015/0144875 A1 May 28, 2015

Related U.S. Application Data

(63) Continuation of application No. PCT/CN2013/079840, filed on Jul. 23, 2013.

(30) Foreign Application Priority Data

Aug. 16, 2012 (CN) .......................... 2012 1 0291658

(51) Int. Cl.
| | |
|---|---|
| H01L 33/04 | (2010.01) |
| H01L 33/00 | (2010.01) |
| H01L 33/32 | (2010.01) |
| H01L 33/38 | (2010.01) |
| H01L 27/15 | (2006.01) |
| H01L 33/06 | (2010.01) |
| H01L 33/10 | (2010.01) |
| H01L 33/24 | (2010.01) |
| H01L 33/40 | (2010.01) |

(52) U.S. Cl.
CPC .......... *H01L 33/0025* (2013.01); *H01L 27/153* (2013.01); *H01L 33/0075* (2013.01); *H01L 33/04* (2013.01); *H01L 33/06* (2013.01); *H01L 33/10* (2013.01); *H01L 33/24* (2013.01); *H01L 33/32* (2013.01); *H01L 33/382* (2013.01); *H01L 33/405* (2013.01); *H01L 33/40* (2013.01); *H01L 2933/0016* (2013.01); *H01L 2933/0083* (2013.01)

(58) Field of Classification Search
CPC ................................ H01L 33/06; H01L 33/10
USPC .................................. 438/29, 42; 257/13, 98
See application file for complete search history.

(56) References Cited

U.S. PATENT DOCUMENTS

| | | | | | |
|---|---|---|---|---|---|
| 5,568,499 | A | * | 10/1996 | Lear | .................... H01S 5/18313 257/21 |
| 2009/0072262 | A1 | * | 3/2009 | Iza | .......................... H01L 33/04 257/98 |

(Continued)

*Primary Examiner* — George Fourson, III
(74) *Attorney, Agent, or Firm* — Syncoda LLC; Feng Ma (57) ABSTRACT

An ultraviolet semiconductor light emitting device includes: a light-emitting epitaxial layer including an n-type semiconductor layer, a light-emitting layer, and a p-type semiconductor layer; a tunnel junction at a non-light-emitting surface of the light-emitting epitaxial layer and having a patterned structure with openings to expose the light-emitting epitaxial layer; an optical phase matching layer over a surface layer of the light-emitting epitaxial layer and transmissive of UV light; and a reflecting layer covering the entire tunneling junction and the optical phase matching layer. A patterned structure is provided over the tunnel junction for full-angle light reflection. Part of the tunneling junction forms ohmic contact with the low work function reflecting metal. The patterned distribution design can effectively reduce the ohmic contact resistance.

20 Claims, 13 Drawing Sheets

(56) References Cited

U.S. PATENT DOCUMENTS

| | | | |
|---|---|---|---|
| 2009/0090932 A1* | 4/2009 | Bour | H01L 33/405 257/103 |
| 2009/0108250 A1* | 4/2009 | Kim | H01L 33/465 257/13 |
| 2015/0115220 A1* | 4/2015 | Iza | H01L 33/12 257/13 |
| 2015/0144875 A1* | 5/2015 | Zhong | H01L 33/32 257/13 |

* cited by examiner

ULTRAVIOLET SEMICONDUCTOR LIGHT-EMITTING DEVICE AND FABRICATION METHOD

CROSS-REFERENCE TO RELATED APPLICATIONS

The present application is a continuation of, and claims priority to, PCT/CN2013/079840, filed Jul. 23, 2013, which claims priorities to Chinese Patent Application No. CN 201210291658.3, filed Aug. 16, 2012. The disclosures of the above applications are hereby incorporated by reference in their entirety.

BACKGROUND

Generally, an ultraviolet light-emitting diode (UV LED) has a multi-layer structure made of different materials. The selection of materials and thicknesses affects the LED light-emitting wavelength. To improve extraction efficiency, the multi-layer structure comprises different chemical components to facilitate independent entry of photocurrent carrier into the recombination region (in general, the quantum well). The quantum well side is added with donor atoms to increase the electron concentration (the N-type layer) and the other side is added with acceptor atoms to increase the hole concentration (the P-type layer).

Figure 1:
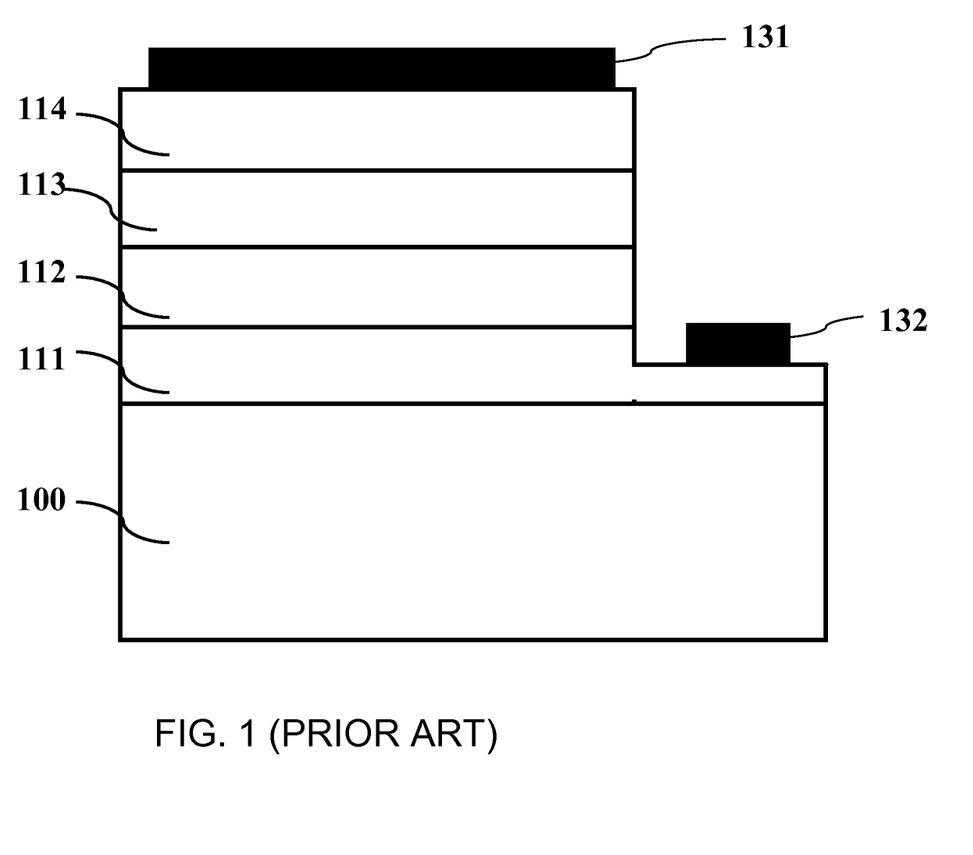
FIG. 1 is a sectional view of a conventional UV semiconductor light-emitting device.

The UV LED also comprises an electronic contact structure. Different electrode structures are selected for power connection based on properties of different devices. The power can provide current for devices through the contact structure. The contact structure injects the current into the light-emitting layer along the device surface and transfers current to light. The contact structure on the UV LED surface can be made of conducting material. Good ohmic contact can reduce contact resistance. However, those structures may prevent the light from emitting, thereby reducing the luminous flux. As shown in FIG. 1, a UV LED structure. The p-GaN layer of the epitaxial covering layer over the surface has a band gap of 3.4 eV (364 nm) and absorbs the UV less than 364 nm from the light-emitting region.

Figure 2:
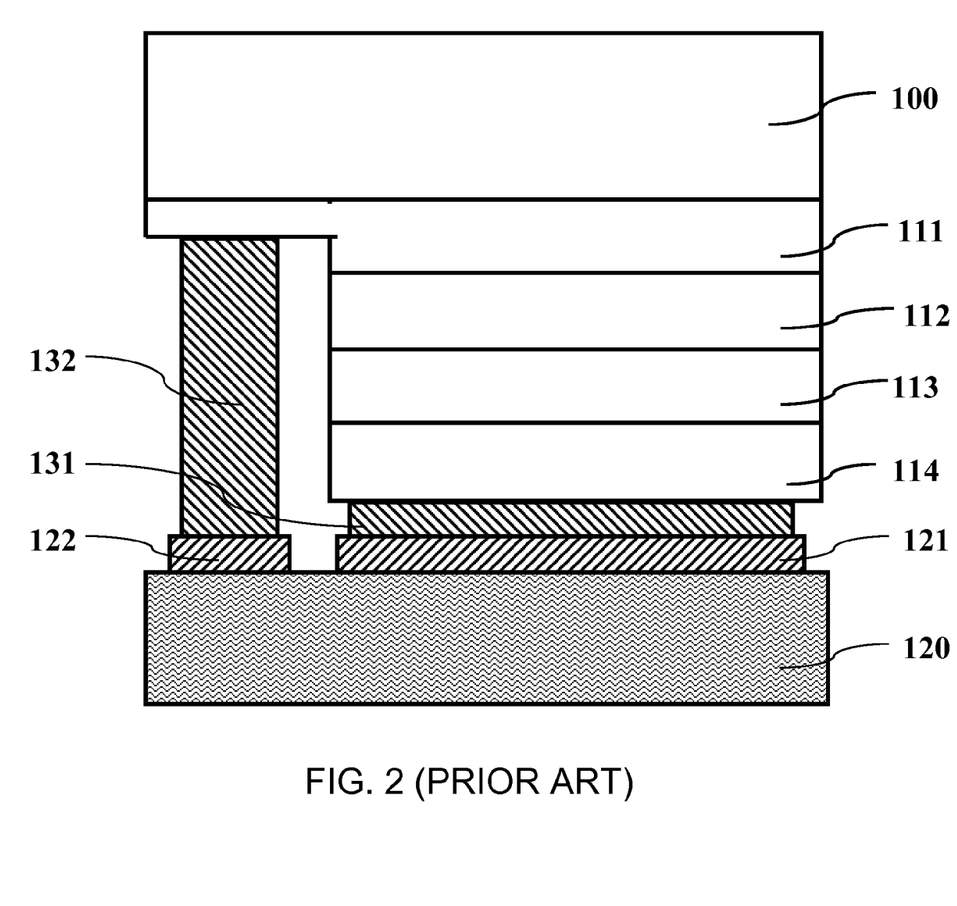
FIG. 2 is a sectional view of a conventional UV semiconductor light-emitting device with a flip-chip structure.
Figure 3:
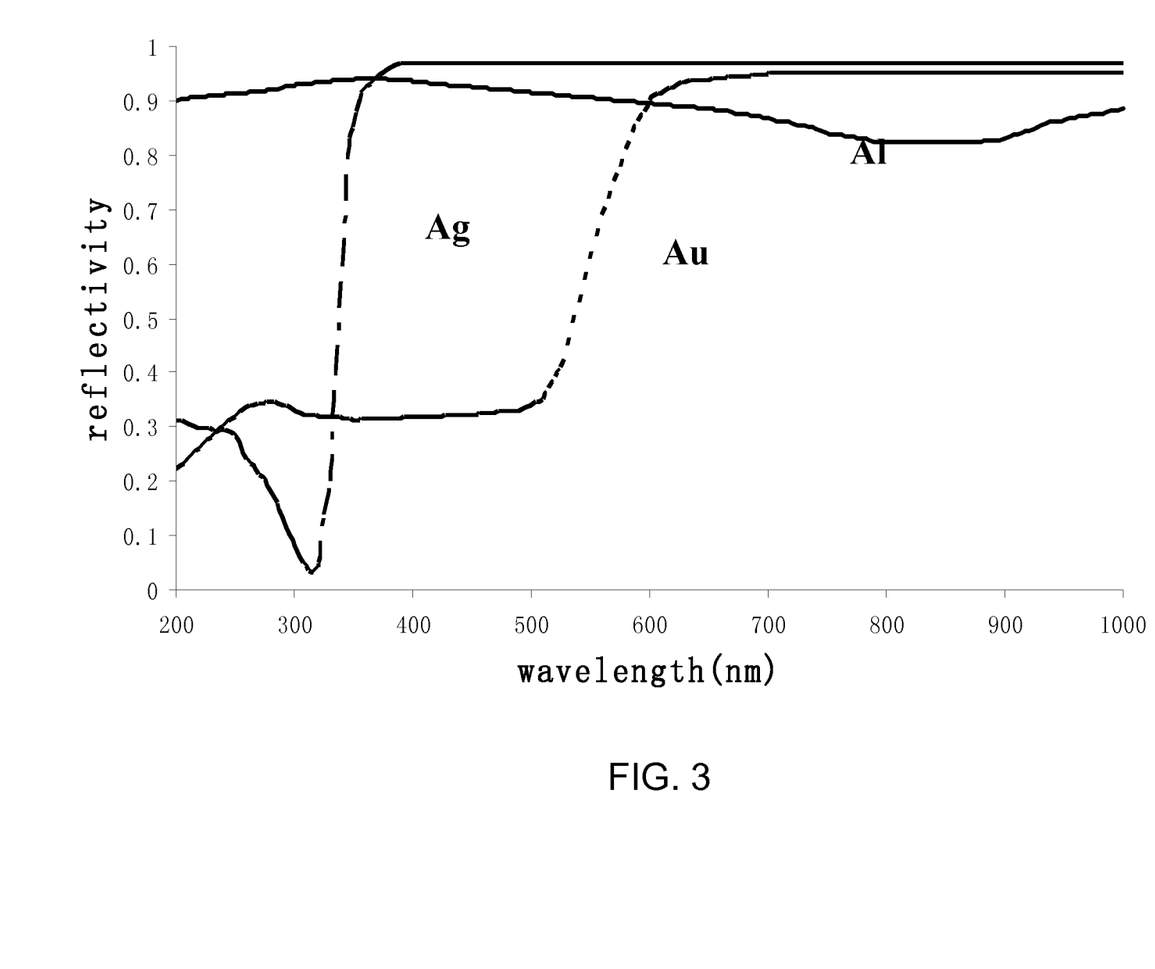
FIG. 3 is a diagram illustrating the luminous reflectivity of various metals within the ultraviolet band.

As shown in FIG. 2, a flip-chip light-emitting structure that can solve light absorption problem of the p-GaN layer. In the flip-chip structure, the reflection efficiency of the reflecting layer is of great importance to the light-emitting efficiency. The work function of the metal reflecting layer and the Schottky barrier height difference of the light-emitting epitaxial layer determine the ohmic contact performance between the reflecting layer and the conductive interface. To form a low-resistance ohmic contact, the ohmic contact layer on the P-type semiconductor adopts metal of high work function and high UV reflectivity. Metal of good reflectivity in the UV region, generally, belongs to low work function metal (for example, Al has good reflectivity in the UV region and the work function is 4.28 eV. It belongs to low work function metal). For existing P-type ohmic contact metal, it is necessary to adopt metal of high work function (e.g., Cr, Ni or Ti) as the medium layer to improve the ohmic contact of the p-type layer. However, the Cr, Ti and Ni have extremely poor reflectivity for UV with wavelength less than 380 nm.

SUMMARY

To solve the above problems, the present disclosure provides a UV semiconductor light-emitting device and fabrication method. The present disclosure improves luminous flux of the UV light-emitting device with wavelength less than 380 nm. Fabricate a multi-layer tunnel junction over the light-emitting epitaxial layer surface and a patterned structure to eliminate the ohmic contact resistance while reducing the UV absorption by the epitaxial surface layer, to improve luminance, reduce resistance and achieve wide application of the high-performance UV light-emitting device.

According to a first aspect of the present disclosure, a UV semiconductor light-emitting device with lighting wavelength of 100-380 nm, comprising: a light-emitting epitaxial structure, comprising an n-type semiconductor layer, a light-emitting layer and a p-type semiconductor layer. One side is a light-emitting surface and the other side is a non-light-emitting surface; a tunnel junction at the non-light-emitting surface side of the light-emitting epitaxial structure. Open hole at part of the region to expose the light-emitting epitaxial structure; an optical phase matching layer over the surface layer of the light-emitting epitaxial structure and penetrates the UV; and a reflecting layer, covering the entire tunnel junction and the optical phase matching layer. A light emitting system can be provided employing a plurality of the UV semiconductor light-emitting devices such as LEDs. The LEDs can form an array, and the system can be a lighting system, for example.

According to a second aspect of the present disclosure, a fabrication method for the UV light-emitting device with light-emitting wavelength of 100-380 nm, comprising: 1) growing an n-type conductive layer, a light-emitting layer, a p-type conductive layer over the growth substrate and forming a light-emitting epitaxial structure. One side is a light-emitting surface and the other side is a non-light-emitting surface; 2) fabricating a tunnel junction over the surface at the non-light-emitting surface side of the light-emitting epitaxial structure; 3) etching the tunnel junction and the light-emitting epitaxial structure at part of region to expose part of the light-emitting epitaxial structure surface; 4) fabricating an optical phase matching layer over the exposed light-emitting epitaxial structure surface; and 5) fabricating a reflecting layer over the tunnel junction and the optical phase matching layer.

In some preferred embodiments, the reflecting layer is low work function material and forms ohmic contact with the tunnel junction. Further, the work function value of the reflecting layer is 4.0-5.0 eV, and the reflectivity for light wave with wavelength less than 380 nm is not less than 70%.

In the present disclosure, fabricate a tunneling junction over the light-emitting epitaxial layer based on the tunneling effect and transfer the upper layer of the tunnel junction into a conductive layer of high doping concentration. Fabricate a pattern structure suitable for full-angle light reflection over the tunnel junction. Part of the tunnel junction forms ohmic contact with the low work function reflecting metal. Adopt patterned distribution design to effectively reduce the ohmic contact resistance. Etch part of the tunnel junction to the optical conductive region to eliminate UV absorption. Fabricate an optical phase matching layer over the exposed light emitting conductive surface layer. Use high efficient and UV-permeable material as the optical phase matching layer to further enhance the UV reflection efficiency.

100: substrate; 111: n-type semiconductor contact layer; 112: light-emitting layer; 113: p-type semiconductor contact layer; 114: p-type covering layer; 131: p electrode; 132: n electrode; 120: supporting substrate; 121, 122: metal layer; 200, 300, 400, 500: growth substrate; 210, 310: light-emitting epitaxial layer; 211, 311: n-type semiconductor contact layer; 212, 312: light-emitting layer; 213, 313: p-type semiconductor contact layer; 220, 320: tunnel junction; 221: p++ $Al_xGa_{1-x}N$ layer; 222: p++ $Al_xGa_{1-x}N$ layer; 230: opening structure; 240, 340: optical phase matching layer; 250, 350: reflecting layer; 261, 361: p electrode; 262, 362: n electrode; 270, 370: supporting substrate; 271, 272, 371: metal layer.

DETAILED DESCRIPTION

References will be made to the following drawings to give a more detailed description of the LED device structure and fabrication method, including the preferred embodiments. It is to be understood that by those skilled in the area that various changes may be made therein without influencing the beneficial effects of the present disclosure.

The embodiments disclose a UV semiconductor light-emitting device and fabrication method. The light-emitting device comprises: a light-emitting epitaxial structure comprising an n-type semiconductor layer, a light-emitting layer and a p-type semiconductor layer. One side of the n-type semiconductor layer is the light-emitting surface and one side of the p-type semiconductor layer is the non-light-emitting surface; a tunnel junction over the p-type semiconductor layer, comprising a high-doping p-type conductive layer and an n-type doping conductive layer. Open hole at part of the region to expose the light-emitting epitaxial structure; an optical phase matching layer over the surface layer of the light-emitting epitaxial structure penetrates the UV; and a reflecting layer, covering the entire tunnel junction and the optical phase matching layer.

Insertion of a tunnel junction structure between the light-emitting epitaxial layer and the reflecting layer guarantees high UV reflectivity from the reflecting layer and reduces the ohmic contact resistance. Open hole at part of the region of the tunnel junction to expose the light-emitting epitaxial structure and fabricate an optical phase matching layer to reduce the UV absorption by the epitaxial surface layer, to improve luminance and to reduce resistance.

The light-emitting epitaxial layer can be a III-V group material and can be binary compound or ternary compound (e.g., AlN, GaN, AlGaN) comprising Al, Ga, N, P and In. In some preferred embodiments, select AlGaN as the material of the light-emitting epitaxial layer, in which, the Al component is not less than 40%. The band gap of the AlGaN combination is controlled by the Al mole fraction. The higher the Al mole fraction is, the larger is the band gap and the shorter is the UV wavelength. In the multi-layer AlGaN light-emitting epitaxial layer, the improvement of Al mole fraction can shorten the UV wavelength and increase the conductivity of the light-emitting layer, so as to improve the performance of the UV semiconductor light-emitting device.

The tunnel junction is over the light-emitting epitaxial layer, comprising a high-doping p-type conductive layer and an n-type doping conductive layer with the doping concentration of $10^{19}$-$10^{20}$ cm$^{-3}$. Open hole at part of the region of the tunnel junction to expose the surface layer of the light-emitting epitaxial layer to form a patterned structure. Preferably, the side has a vertical slope with gradient between 10°-85°. The tunnel junction can be band shape or island shape. For band shape structure, the top section can be trapezoid shape, triangle and arc shape; and the island structure specifically includes round platform, trapezoid platform, cone shape, or hemispheric structure, etc.

The optical phase matching layer is over the surface of the light-emitting epitaxial layer in the opening region of the tunnel junction. The optical thickness is odd number of times of the ¼ of the light-emitting wavelength. Select good UV-penetrable insulation material, preferably, diamond, AlN thin film or $SiO_2$ thin film. To guarantee ohmic contact between the reflecting layer and the epitaxial layer, the optical phase matching layer cannot be too large (in general, within 50% of the area of the light-emitting layer).

The reflecting layer covers the entire tunnel junction and the optical phase matching layer. To guarantee UV reflectivity from the reflecting layer, select low work function material. In some preferred embodiments, the work function value of the reflecting layer is 4.0-5.0 eV, and the reflectivity for light wave with wavelength less than 380 nm is not less than 70%. For example, Al, Ag or their combinations.

A fabrication method for the light-emitting device, mainly comprising: 1) growing an n-type conductive layer, a light-emitting layer, a p-type conductive layer over the growth substrate via epitaxial growth and forming a light-emitting epitaxial layer. One side is a light-emitting surface and the other side is a non-light-emitting surface; 2) fabricating a high-doping p-type conductive layer and an n-type doping conductive layer to form a tunnel junction over the surface at the non-light-emitting surface side of the light-emitting epitaxial layer; 3) etching the tunnel junction and the light-emitting epitaxial layer at part of region to expose part of the light-emitting epitaxial layer surface; 4) fabricating an optical phase matching layer over the exposed light-emitting epitaxial layer; and 5) fabricating a reflecting layer over the tunnel junction and the optical phase matching layer.

The growth substrate can be mono-crystal material or poly-crystalline material. In some embodiments, the growth substrate is good UV-penetrable and transparent material with the band gap not less than 3.4 eV (e.g., AlN or sapphire). In steps 1) and 2), deposit an epitaxial layer over the growth substrate via MOCVD. The epitaxial layer structure can be n-type conductive layer, light-emitting layer, p-type conductive layer and tunnel junction or buffer layer, n-type current expansion layer, etc. In step 3), firstly determine the pattern of the tunnel junction. Fabricate a three-dimensional pattern over the tunnel junction via yellow light photoetching and dry etching to form a series of opening structures. The etching depth is less than 0.5 nm. In Step 4), simulate thickness of the optical phase matching layer by Maxwell equation. Deposit a good UV-penetrable insulation material layer over the light-emitting epitaxial layer surface in the opening structure to form an optical phase matching layer.

In some embodiments, fabricate a p electrode and an n electrode over the p-type conductive layer and the n-type conductive layer respectively; provide a supporting substrate, over which distributed with a patterned metal material layer; bond the metal material layer with the p electrode and the n electrode; thin the growth substrate to form a flip-chip light-emitting device. In some embodiments, form an electrode bonding layer over the reflecting layer; provide a supporting substrate and bond it with the electrode bonding layer via eutectic bonding; remove the growth substrate and expose the light-emitting epitaxial layer, over which fabricate an electrode to form a vertical light-emitting device.

Detailed descriptions will be given with reference to the following embodiments and drawings.

Embodiment 1

FIGS. 4-12 are structural sections of each step for fabrication method of a flip-chip UV semiconductor light-emitting device, comprising the following steps.

Figure 4:
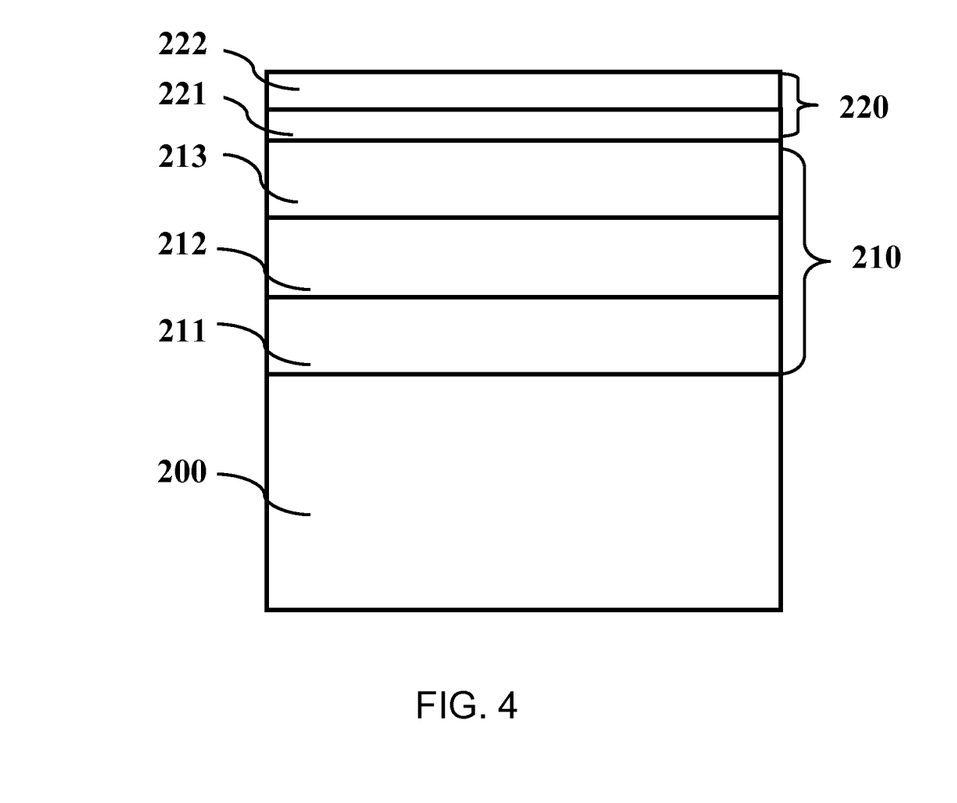
FIG. 4 illustrates a first step of fabricating a flip-chip UV semiconductor light-emitting device according to a first embodiment.

As shown in FIG. 4, select a sapphire growth substrate 100 and fabricate an n-type AlxGa$_1$-xN layer 211, an Al$_x$Ga$_{1-x}$N/n-Al$_x$Ga$_{1-x}$N multi-quantum well light-emitting layer 212 and a p-type AlxGa$_1$-xN layer 213 via epitaxial growth to form a light-emitting epitaxial layer 210. Where, x≥0.4. Deposit a multilayer p++ Al$_x$Ga$_{1-x}$N/n++ Al$_x$Ga$_{1-x}$N layer over the p-type AlxGa$_1$-xN layer 213 to form the tunnel junction 220.

Figure 5:
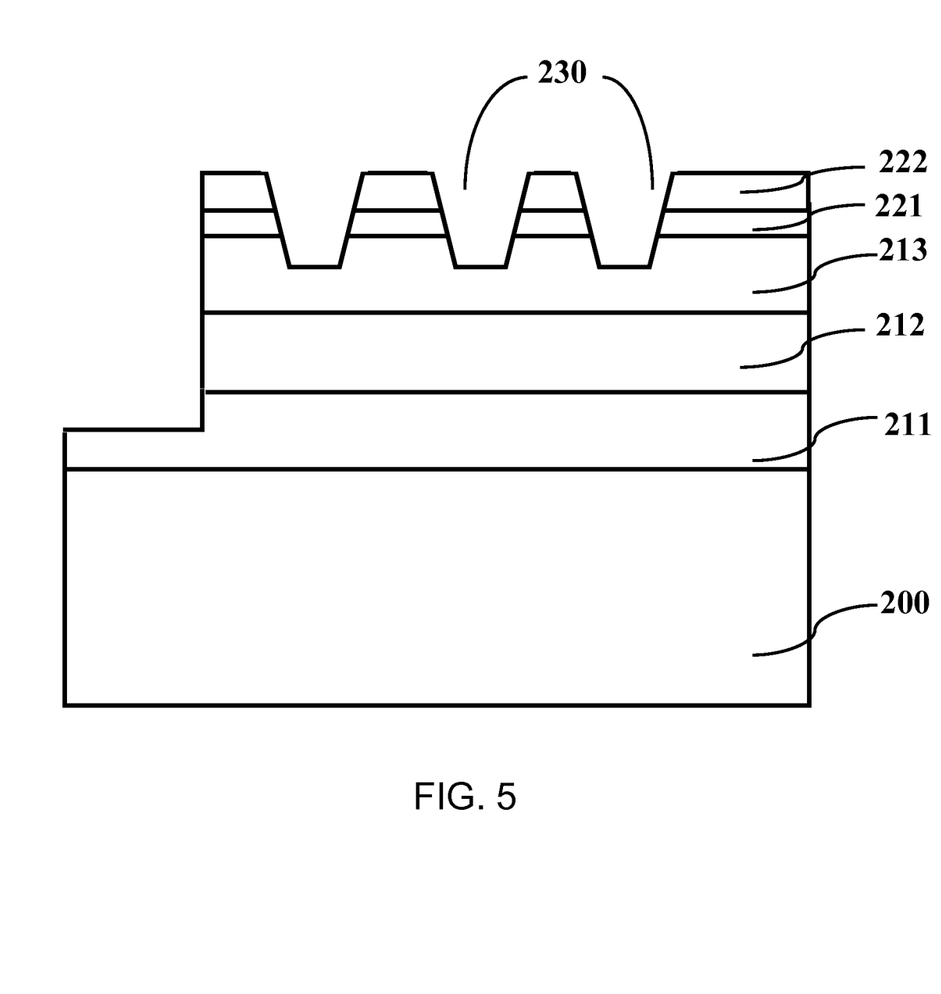
FIG. 5 illustrates a second step.

As shown in FIG. 5, etch part of region of the tunnel junction 220 and the p-type AlxGa$_1$-xN layer 213 via yellow light photoetching and dry etching to expose the surface of the p-type AlxGa$_1$-xN layer 213. Form a series of opening structures 230 to patternize the tunnel junction 220 and obtain a three-dimensional pattern structure. Wherein, the opening can be mesoporous shape or band shape. Determine the luminous mesa and the n electrode region. Etch the tunnel junction 220 of the n electrode region, the p-type AlxGa$_1$-xN layer 213 and the multi-quantum well light-emitting layer 212 to expose the n-type AlxGa$_1$-xN layer 211 surface.

Figure 6:
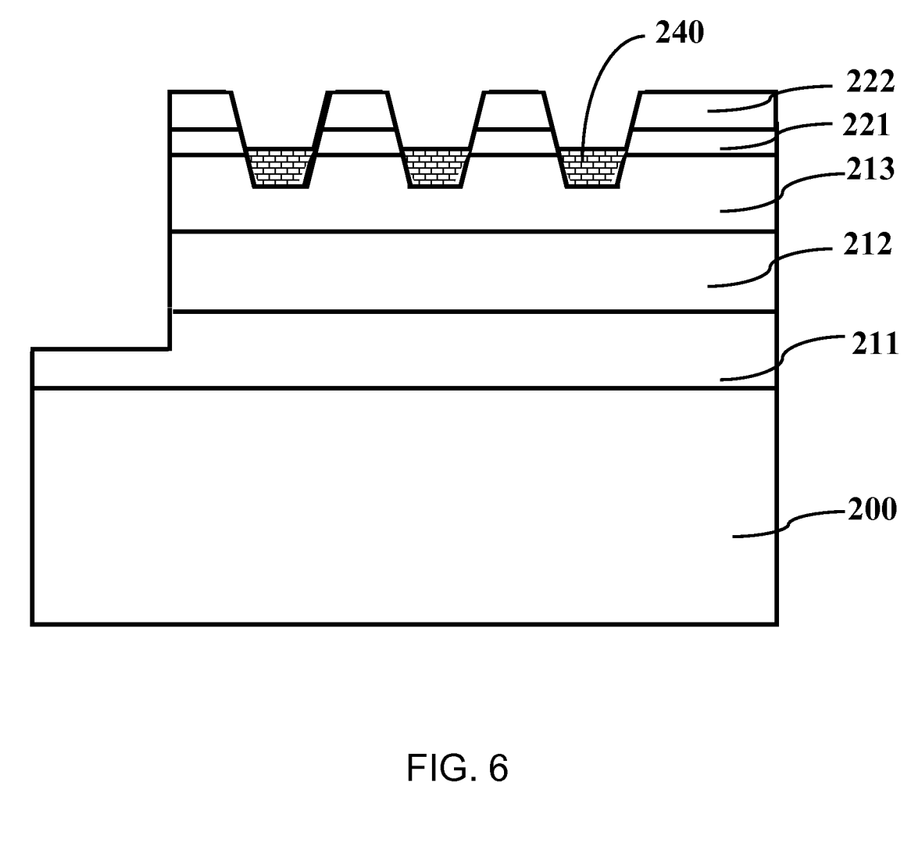
FIG. 6 illustrates a third step.
Figure 7:
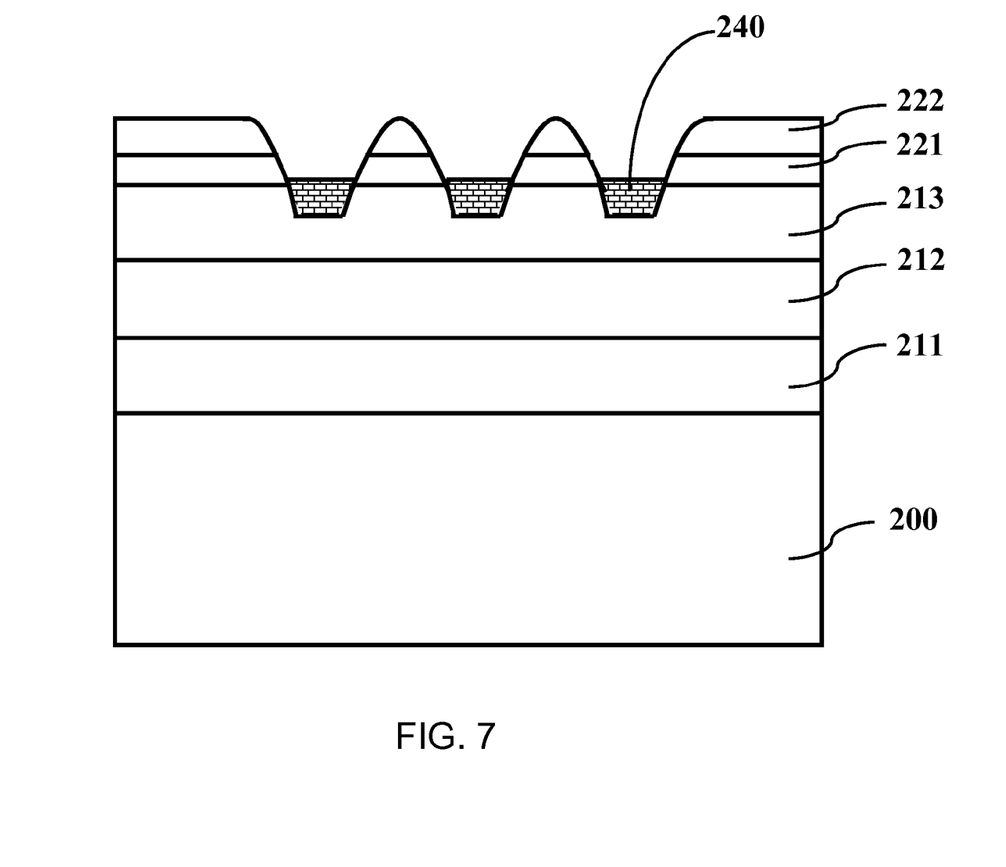
FIG. 7 illustrates a fourth step.
Figure 8:
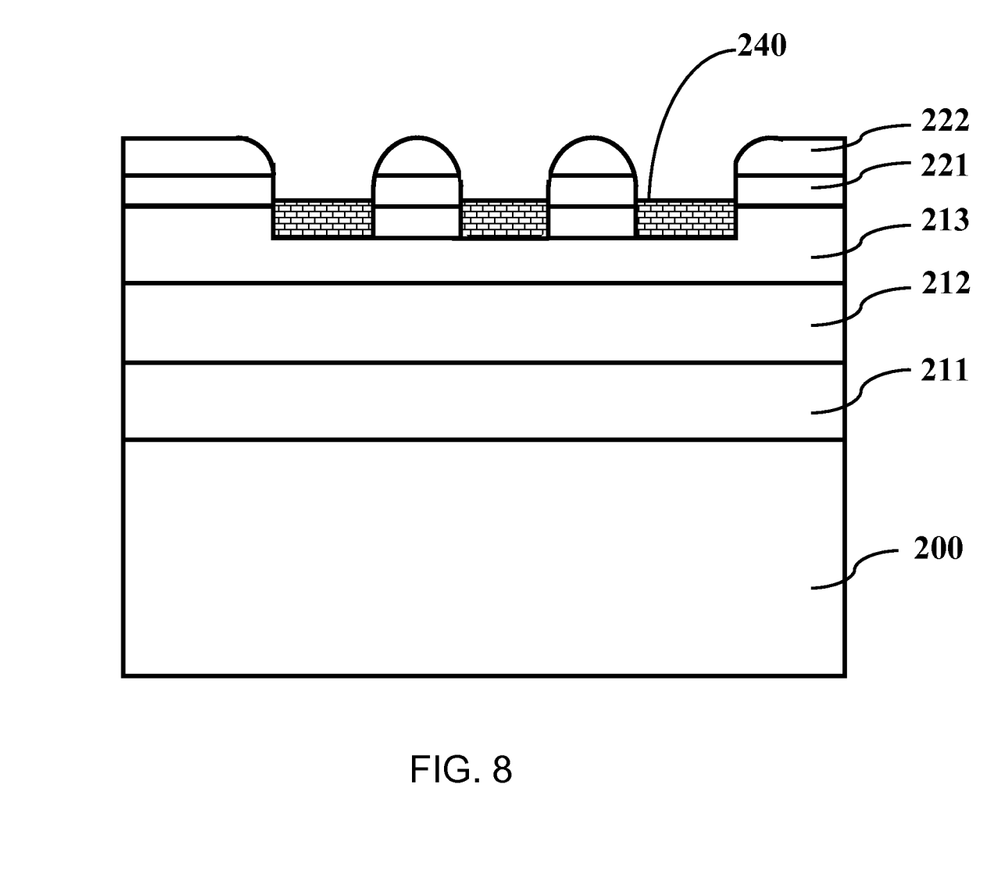
FIG. 8 illustrates a fifth step.
Figure 9:
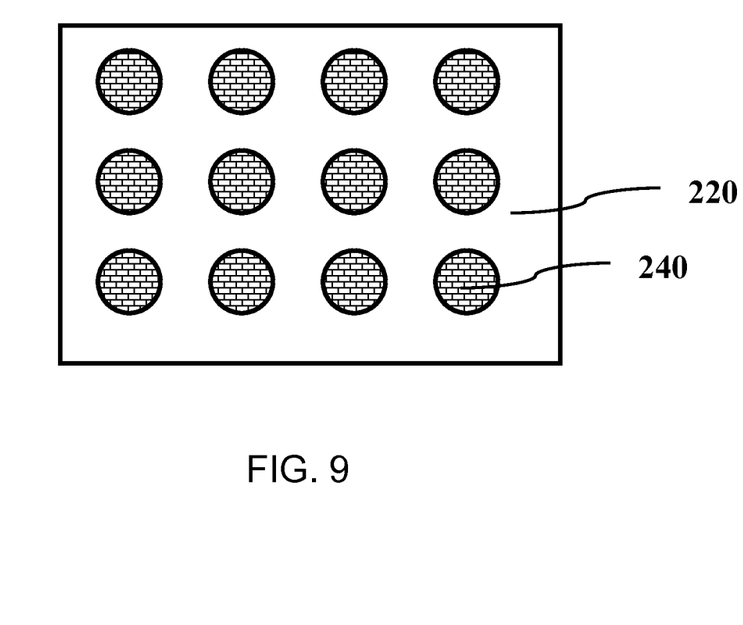
FIG. 9 illustrates a sixth step.
Figure 10:
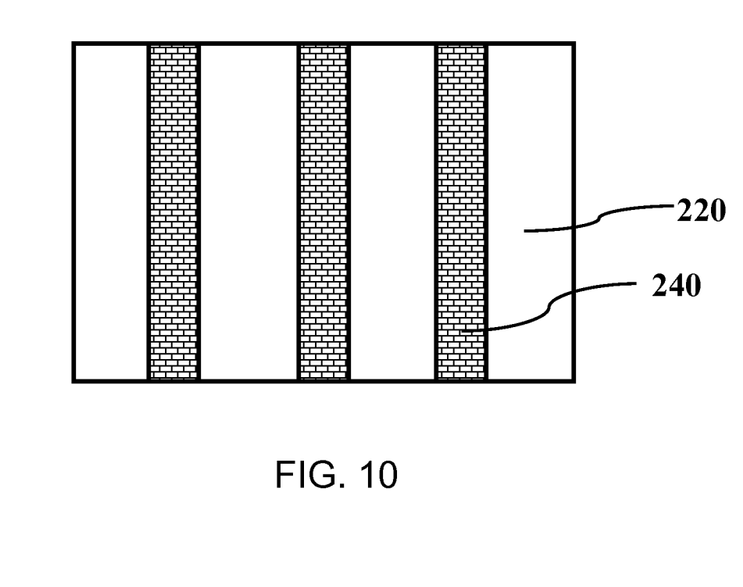
FIG. 10 illustrates a seventh step.

As shown in FIG. 6, deposit a SiO$_2$ layer as the optical phase matching layer 240 over the surface of the exposed p-type AlxGa$_1$-xN layer 213 in the opening structure 230. The thickness is odd number of times of the ¼ of the light-emitting wavelength and the area is 20%-50% of the light-emitting layer. As shown in FIGS. 6-10, the tunnel junction 220 can be band shape, island shape, round platform, trapezoid platform, taper or hemispheric structure.

Figure 11:
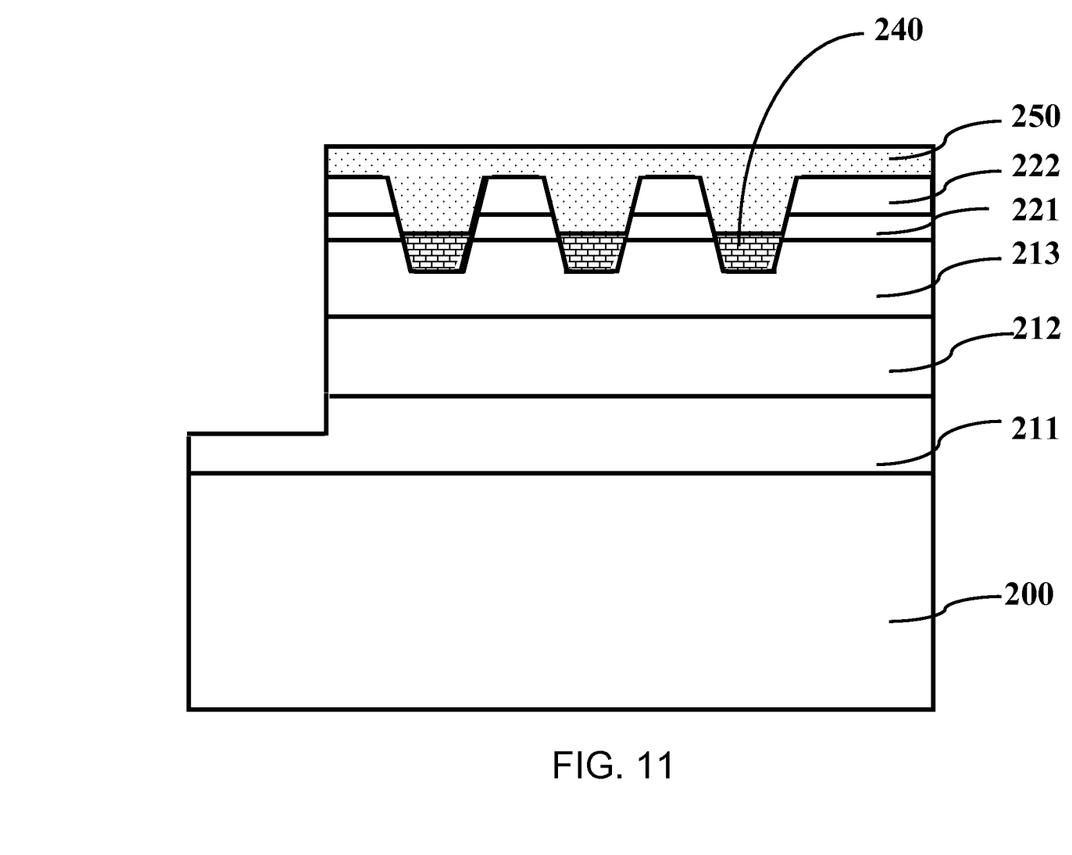
FIG. 11 illustrates an eighth step.

As shown in FIG. 11, fabricate the Al reflecting layer 250 over the tunnel junction 220 and the optical phase matching layer 240.

Figure 12:
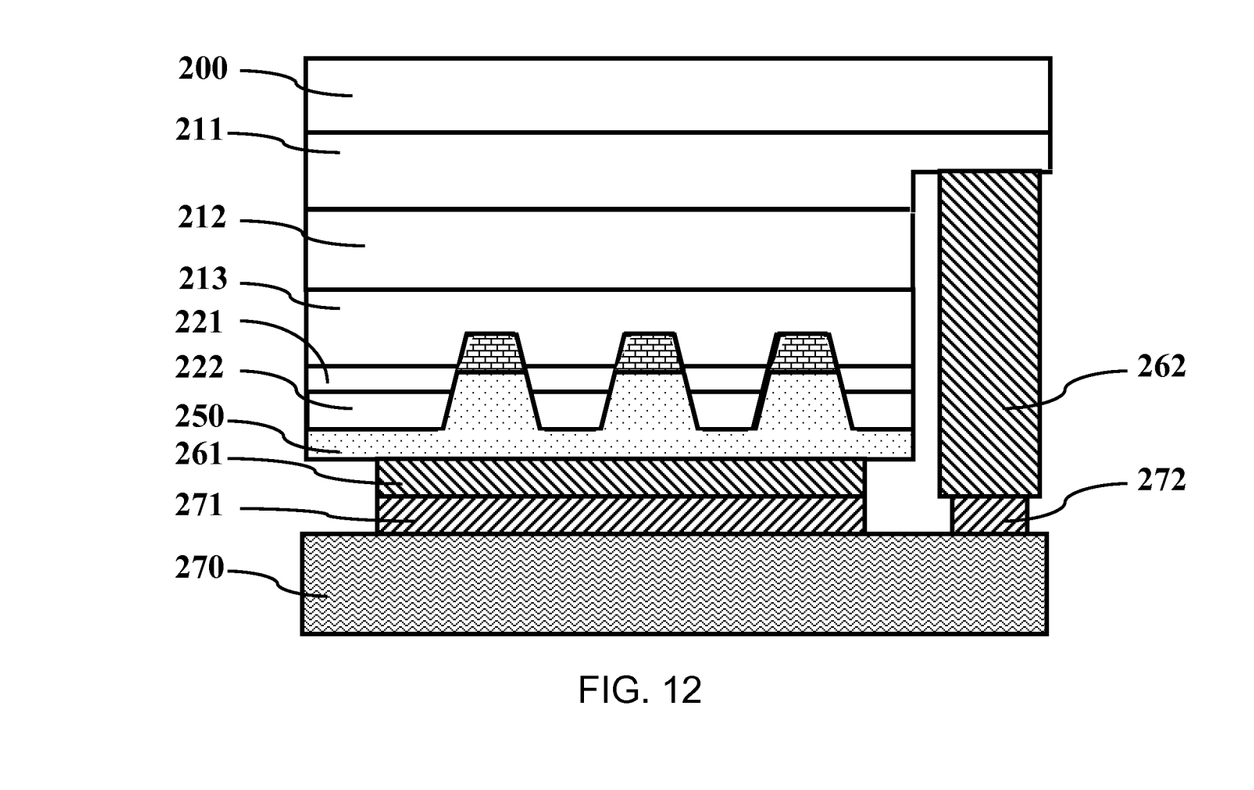
FIG. 12 illustrates a ninth step.

As shown in FIG. 12, fabricate the p electrode 261 over the Al reflecting layer 250 and the n electrode 262 over the Al$_x$Ga$_{1-x}$N layer 211 surface in the n electrode region.

As shown in FIG. 12, provide a heat-dissipation supporting substrate 270 and form the patterned metal layers 271 and 272. Bond the light-emitting structure with the supporting substrate 270, wherein, the p electrode 261 corresponds to the metal layer 271 and the n electrode 262 corresponds to the metal layer 272. Thin the sapphire substrate 200 to form a flip-chip light-emitting device. In this embodiment, the Al reflecting layer has good UV reflectivity; the patterned tunnel junction 220 guarantees the conductive performance of the Al and the epitaxial layer while eliminating the UV absorption by the epitaxial layer; the SiO$_2$ optical phase matching layer 240, on the one hand, corrects the light refraction path from the light-emitting layer and on the other hand, increases current injection density and improves the luminous efficiency.

Embodiment 2

Figure 13:
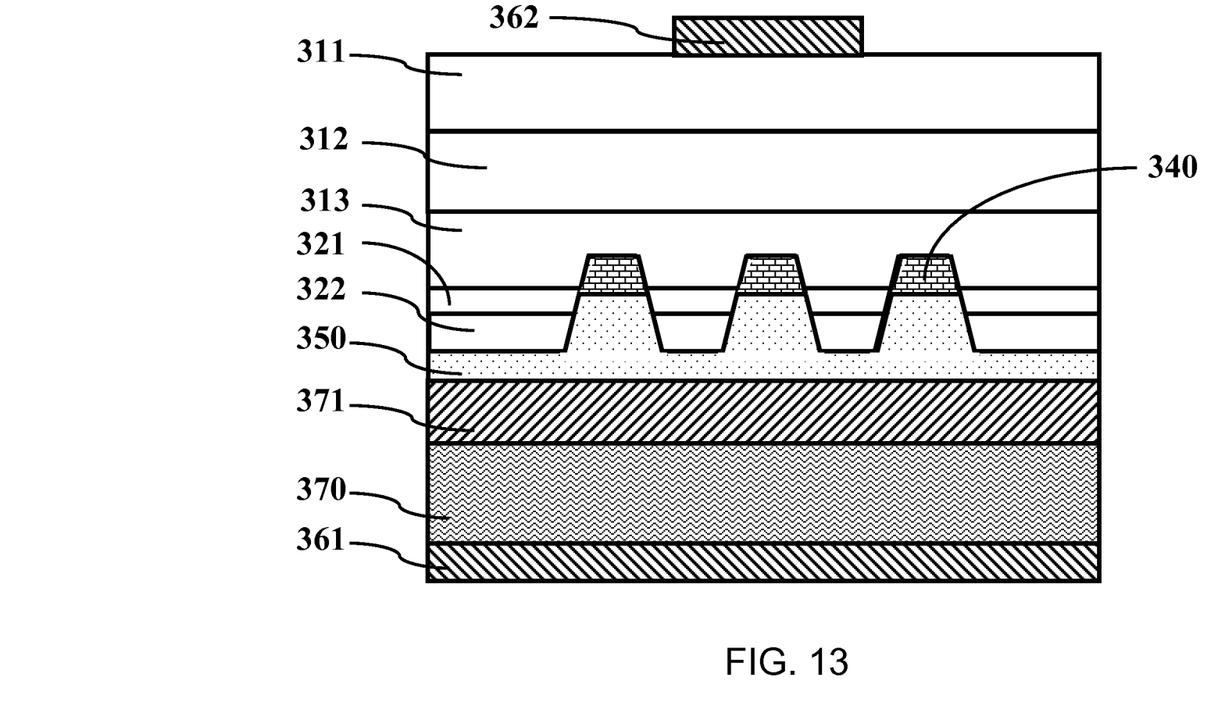
FIG. 13 is a structural sectional view of a vertical UV semiconductor light-emitting device according to a second embodiment.

FIG. 13 is a structural diagram of a vertical UV semiconductor light emitting device, comprising bottom-up: a p electrode 361, a supporting substrate 370, a metal bonding layer 371, a reflecting layer 350, a patterned tunnel junction 320, an optical phase matching layer 340, a p-type Al$_x$Ga$_{1-x}$N layer 313, an Al$_x$Ga$_{1-x}$N/n-Al$_x$Ga$_{1-x}$N multi-quantum well light-emitting layer 312, an n-type Al$_x$Ga$_{1-x}$N layer 311 and an n electrode 362.

In this embodiment, form a light-emitting epitaxial layer 310 and a tunnel junction 320 over the sapphire substrate via epitaxial growth; fabricate a three-dimension pattern over the tunnel junction 320; fabricate an optical phase matching layer 340; fabricate a reflecting layer 350 over the tunnel junction 320 and the optical phase matching layer 340. Inverse the light-emitting epitaxial layer 310 over the conductive supporting substrate 370 via eutectic bonding technology. Remove the sapphire substrate via chemical etching, grinding or laser lift-off and fabricate the n electrode 362 over the exposed n-type Al$_x$Ga$_{1-x}$N layer 311.

As a variation of the embodiment, thin the sapphire substrate without removing it. Fabricate a through hole and pour conductive material into it to form a conductive path. Fabricate an n-type electrode over the back to form an optical supporting structure, which on the one hand, serves as a light extraction structure and on the other hand, guarantees completeness of the epitaxial structure.

As another variation of the embodiment, select a light-transmitting conductive substrate as the growth substrate. In this way, directly fabricate the n electrode over the back of the growth substrate without removing it.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A UV semiconductor light-emitting device, comprising:
a light-emitting epitaxial layer having one side as a light-emitting surface and another side as a non-light-emitting surface and comprising an n-type semiconductor layer, a light-emitting layer, and a p-type semiconductor layer;
a tunneling junction at the non-light-emitting side and comprising a patterned structure having openings to expose the light-emitting epitaxial layer;
an optical phase matching layer over a surface layer of the light-emitting epitaxial layer and transmissive of UV light; and
a reflecting layer covering the tunneling junction and the optical phase matching layer.

2. The semiconductor light-emitting device of claim 1, wherein the reflecting layer comprises a material having a work function of about 4.0-5.0 eV, and forms ohmic contact with the tunneling junction.

3. The semiconductor light-emitting device of claim 2, wherein the reflecting layer has a work function value of about 4.0-5.0 eV, and a reflectivity of not less than 70% for light with wavelengths less than 380 nm.

4. The semiconductor light-emitting device of claim 1, wherein the tunneling junction has a patterned structure and a side with a solid slope with a gradient between 10°-85°.

5. The semiconductor light-emitting device of claim 4, wherein the patterned structure comprises at least one of a band shape, an island shape, a round platform, a trapezoid platform, a cone shape, or a hemispheric shape.

6. The semiconductor light-emitting device of claim 1, wherein the light-emitting epitaxial layer comprises a III-V group material that is a binary compound or ternary compound comprising at least one of Al, Ga, N, P, or In.

7. The semiconductor light-emitting device of claim 6, wherein the III-V group material is AlGaN having an Al concentration of not less than 40%.

8. The semiconductor light-emitting device of claim 1, wherein: the optical phase matching layer is composed of an insulation material.

9. A method of fabricating a UV light-emitting device with wavelengths of about 100-380 nm, the method comprising:
   (1) fabricating an n-type conductive layer, a light-emitting layer, a p-type conductive layer over a growth substrate and forming a light-emitting epitaxial layer having one side as a light-emitting surface and another side as a non-light-emitting surface;
   (2) fabricating a tunneling junction over the non-light-emitting surface;
   (3) patterning the tunneling junction including etching an area of the tunneling junction and the light-emitting epitaxial layer to expose a portion of the light-emitting epitaxial layer surface;
   (4) fabricating an optical phase matching layer over the exposed light-emitting epitaxial layer surface; and
   (5) fabricating a reflecting layer over the tunneling junction and the optical phase matching layer.

10. The fabrication method of claim 9, wherein the growth substrate is substantially transparent and UV-permeable with a band gap not less than 3.4 eV.

11. The fabrication method of claim 9, wherein the step (3) comprises fabricating a three-dimensional pattern at the tunneling junction by yellow light photoetching and dry etching with an etching depth not less than 0.5 nm.

12. The fabrication method of claim 9, wherein the reflecting layer comprises a material with a work function of 4.0-5.0 eV and forming ohmic contact with the tunneling junction.

13. The fabrication method of claim 9, further comprising:
   fabricating a p-electrode and an n-electrode over the p-type semiconductor layer and the n-type semiconductor layer, respectively;
   providing a supporting substrate having a patterned metal layer thereon, which bonds the supporting substrate with the p-electrode and the n-electrode; and
   thinning the growth substrate to form a flip-chip light-emitting device.

14. The fabrication method of claim 9, further comprising:
   forming an electrode bonding layer over the reflecting layer;
   providing a supporting substrate and bonding the supporting substrate with the electrode bonding layer; and
   removing the growth substrate to expose the light-emitting epitaxial layer, over which fabricating an electrode, to thereby form a vertical light-emitting device.

15. A system comprising a plurality of UV semiconductor light-emitting devices, each device comprising:
   a light-emitting epitaxial layer having one side as a light-emitting surface and another side as a non-light-emitting surface and comprising an n-type semiconductor layer, a light-emitting layer, and a p-type semiconductor layer;
   a tunneling junction at the non-light-emitting side and comprising a patterned structure having openings to expose the light-emitting epitaxial layer;
   an optical phase matching layer over a surface layer of the light-emitting epitaxial layer and transmissive of UV light; and
   a reflecting layer covering the tunneling junction and the optical phase matching layer.

16. The system of claim 15, wherein the reflecting layer comprises a material having a work function of about 4.0-5.0 eV, and forms ohmic contact with the tunneling junction.

17. The system of claim 16, wherein the reflecting layer has a work function value of about 4.0-5.0 eV, and a reflectivity of not less than 70% for light with wavelengths less than 380 nm.

18. The system of claim 15, wherein the tunneling junction has a patterned structure and a side with a solid slope with a gradient between 10°-85°.

19. The system of claim 18, wherein the patterned structure comprises at least one of a band shape, an island shape, a round platform, a trapezoid platform, a cone shape, or a hemispheric shape.

20. The system of claim 15, wherein the light-emitting epitaxial layer comprises a III-V group material that is a binary compound or ternary compound comprising at least one of Al, Ga, N, P, or In.

\* \* \* \* \*